(12) United States Patent
Chan et al.

(10) Patent No.: US 10,490,442 B2
(45) Date of Patent: Nov. 26, 2019

(54) METHOD FOR BLOCKING A TRENCH PORTION

(71) Applicant: IMEC VZW, Leuven (BE)

(72) Inventors: Boon Teik Chan, Leuven (BE); Ming Mao, Leuven (BE); Peter De Schepper, Antwerp (BE); Michael Kocsis, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/903,909

(22) Filed: Feb. 23, 2018

(65) Prior Publication Data

US 2018/0240699 A1    Aug. 23, 2018

(30) Foreign Application Priority Data

Feb. 23, 2017  (EP) ..................... 17157578

(51) Int. Cl.
*H01L 21/768* (2006.01)
*H01L 21/762* (2006.01)
(Continued)

(52) U.S. Cl.
CPC .... *H01L 21/76802* (2013.01); *H01L 21/0274* (2013.01); *H01L 21/033* (2013.01);
(Continued)

(58) Field of Classification Search
None
See application file for complete search history.

(56) References Cited

U.S. PATENT DOCUMENTS

| 9,373,582 B1 | 6/2016 | Feurprier et al. |
| 2013/0072017 A1 | 3/2013 | Belledent et al. |
| 2014/0199843 A1 | 7/2014 | Tsujita et al. |

FOREIGN PATENT DOCUMENTS

| EP | 2 392 969 B1 | 9/2015 |
| EP | 3 035 379 A1 | 6/2016 |

(Continued)

OTHER PUBLICATIONS

Kobayashi, Shinji et al., "Analyzing Block Placement Errors in SADP Patterning", Proceedings of SPIE, vol. 9779, Mar. 21, 2016, 13 pages.

(Continued)

*Primary Examiner* — Wael M Fahmy
*Assistant Examiner* — Sarah K Salerno
(74) *Attorney, Agent, or Firm* — McDonnell Boehnen Hulbert & Berghoff LLP

(57) ABSTRACT

An example embodiment may include a method for blocking one or more portions of one or more trenches during manufacture of a semiconductor structure. The method may include (i) providing a substrate comprising one or more trenches, and a dielectric material under the one or more trenches, (ii) providing a first overlayer on the substrate, thereby filling the one or more trenches, the first overlayer having a planar top surface, a top portion of the first overlayer, comprising the top surface, being etchable selectively with respect to a condensed photo-condensable metal oxide, (iii) covering a first area of the top surface, situated directly above the one or more portions and corresponding thereto, with a block pattern of the condensed photo-condensable metal oxide, thereby leaving a second area of the top surface, having at least another portion of at least one of the trenches thereunder, uncovered.

14 Claims, 14 Drawing Sheets

(51) Int. Cl.
    *H01L 21/311*     (2006.01)
    *H01L 21/3105*     (2006.01)
    *H01L 21/033*     (2006.01)
    *H01L 23/522*     (2006.01)
    *H01L 29/06*     (2006.01)
    *H01L 21/027*     (2006.01)
    *H01L 21/8234*     (2006.01)

(52) U.S. Cl.
    CPC ...... *H01L 21/0332* (2013.01); *H01L 21/0337* (2013.01); *H01L 21/31051* (2013.01); *H01L 21/31144* (2013.01); *H01L 21/76224* (2013.01); *H01L 21/76811* (2013.01); *H01L 21/76813* (2013.01); *H01L 21/76816* (2013.01); *H01L 21/76897* (2013.01); *H01L 23/5226* (2013.01); *H01L 29/0649* (2013.01); *H01L 21/76843* (2013.01); *H01L 21/76877* (2013.01); *H01L 21/823475* (2013.01); *H01L 21/823481* (2013.01)

(56) References Cited

FOREIGN PATENT DOCUMENTS

| | | |
|---|---|---|
| WO | 2012/118847 A2 | 9/2012 |
| WO | 2015/026482 A2 | 2/2015 |

OTHER PUBLICATIONS

European Search Report, European Patent Application No. 17157578.0, dated Aug. 21, 2017, 6 pages.

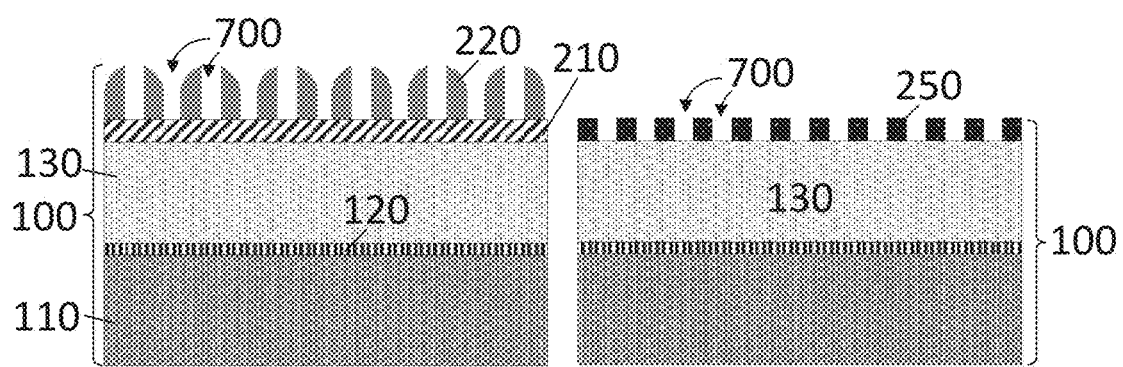
FIG. 1a FIG. 1b

METHOD FOR BLOCKING A TRENCH PORTION

CROSS-REFERENCE TO RELATED APPLICATIONS

The present application is a non-provisional patent application claiming priority to European Patent Application No. 17157578.0, filed on Feb. 23, 2017, the contents of which are hereby incorporated by reference.

FIELD OF THE DISCLOSURE

The present disclosure relates to manufacturing of semiconductor structures and in particular to blocking one or more trench portions during said manufacturing.

BACKGROUND

In the manufacture of semiconductor devices, especially on advanced nodes, multiple lithographic layer stacks and multiple lithographic exposure and etch sequences are required for forming vias and connecting lines in the Back End Of Line (BEOL).

A typical sequence for the formation of such connecting lines is described in Kobayashi, Shinji, et al. "Analyzing block placement errors in SADP patterning." Proc. Of SPIE Vol 9779, 2016. This sequence starts by forming a pattern of spacer-defined trenches, followed by providing a lithographic stack and performing a first lithographic exposure and etch sequence to form blocks above portions of the trenches. Subsequently, the trench pattern is etched deeper into the substrate, such as into a hard mask layer in the substrate, whereby the blocks define interruptions in the trenches.

Once the wished interrupted trench pattern is transferred in the hard mask, in order to form vias, it is typical to use a second lithographic stack and a second lithographic exposure and etch sequence to pattern vias into the hard mask. After both the via and trench patterns have been etched to the depth in the dielectric underlying the hard mask, the corresponding openings may be filled with a conductive metal to form the vias and connecting lines. A flowchart of this process up to the etching in the dielectric is shown in FIG. 8.

There still exists a need for more straightforward BEOL methods.

SUMMARY

In a first aspect, the present disclosure relates to a method for blocking one or more portions of one or more trenches during manufacture of a semiconductor structure, the method comprising (a) providing a substrate comprising one or more trenches, and a dielectric material under the one or more trenches, (b) providing a first overlayer on the substrate, thereby filling the one or more trenches, the first overlayer having a planar top surface, a top portion of the first overlayer, comprising the top surface, being etchable selectively with respect to a condensed photo-condensable metal oxide, (c) covering a first area of the top surface, situated directly above the one or more portions and corresponding thereto, with a block pattern of the condensed photo-condensable metal oxide, thereby leaving a second area of the top surface, having at least another portion of at least one of the trenches thereunder, uncovered, (d) covering the block pattern and the second area with a second overlayer having a planar top surface, a bottom portion of the second overlayer, in contact with the block pattern and the second area, being etchable selectively with respect to the condensed photo-condensable metal oxide and with respect to the top portion of the first overlayer, (e) providing a masking layer over the second overlayer, the masking layer having a via pattern, and (f) transferring the via pattern and the other portion of the at least one of the trenches into the dielectric material.

In a second aspect, the present disclosure relates to a semiconductor structure, comprising (a) a substrate comprising one or more trenches, and a dielectric material under the one or more trenches, (b) a first overlayer on the substrate, filling the one or more trenches and having a planar top surface, a top portion of the first overlayer, comprising the top surface, being etchable selectively with respect to a condensed photo-condensable metal oxide, (c) a block pattern of a condensed photo-condensable metal oxide, the block pattern covering a first area of the top surface, the first area being situated directly above one or more portions of the one or more trenches and corresponding to these portions, a second area of the top surface, having at least another portion of at least one of the trenches thereunder, remaining uncovered, and (d) a second overlayer having a planar top surface, a bottom portion of the second overlayer, in contact with the block pattern and the second area, being etchable selectively with respect to the condensed photo-condensable metal oxide and with respect to the top portion of the first overlayer.

Some aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and aspects of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

FIGS. 1a and 1b are schematic representations of vertical cross-sections of two substrates, according to an example embodiment.

Figure 2A:
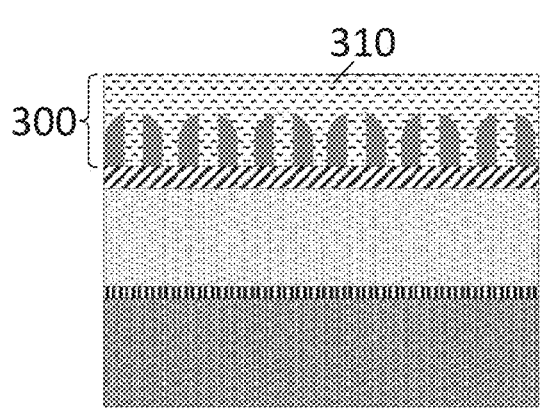
FIGS. 2a-2d are schematic representations of vertical cross-sections of semiconductor structures obtained at different stages of manufacture, according to an example embodiment.
Figure 2B:
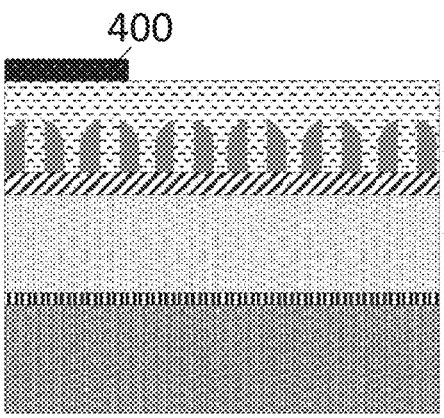
Figure 2C:
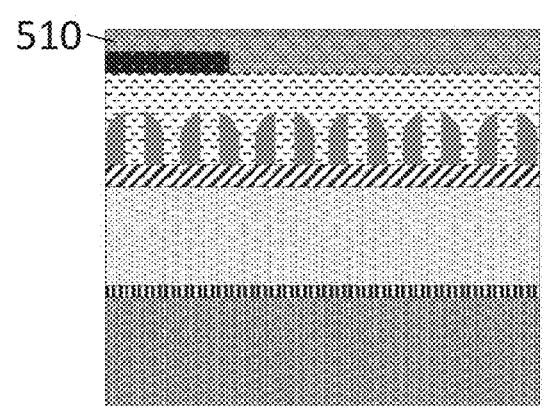
Figure 2D:
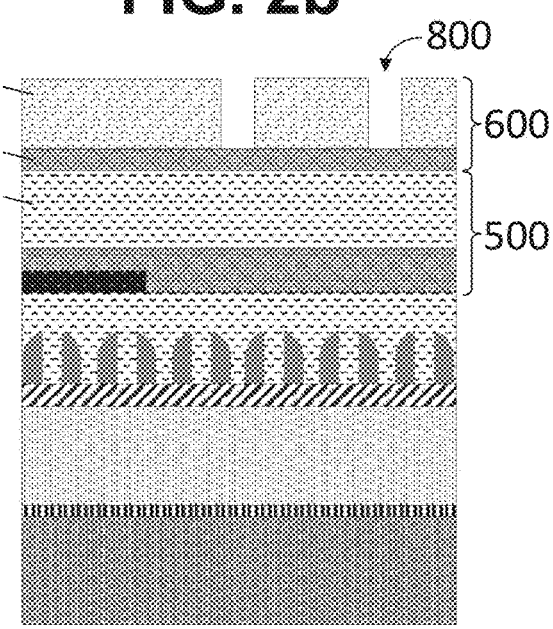

In the different figures, the same reference signs refer to the same or analogous elements.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms "first, second, third" and the like in the description and in the claims, are used for distinguishing between similar elements and not necessarily for describing a sequence, either temporally, spatially, in ranking or in any other manner. It is to be understood that the terms so used are interchangeable under some circumstances and that the embodiments of the disclosure described herein are capable of operation in other sequences than described or illustrated herein.

Moreover, the terms "top, bottom, over, under" and the like in the description and the claims are used for descriptive purposes and not necessarily for describing relative positions. It is to be understood that the terms so used are interchangeable under some circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claims require more features than are expressly recited in each claim. Rather, as the following claims reflect, some aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that some embodiments may be practiced without these specific details. In other instances, well-known methods, structures and techniques have not been shown in detail in order not to obscure an understanding of this description.

The following term is provided solely to aid in the understanding of the disclosure.

As used herein, when a first material is said to be etched selectively with respect to a second material, this means that the first material is etched faster than the second material. The etching process may etch the first material at least twice faster, possibly at least five times faster, and potentially at least 10 times faster, than the second material. In some embodiments, the second material may be substantially not etched by the etching process.

As used herein, and unless provided otherwise, the term metal encompasses alkali metals, alkaline earth metals, transition metals, post-transition metals, lanthanides and actinides. It excludes metalloids (B, Si, Ge As, Sb, Te) and non-metals (C, P, S, Se, H, N, O, F, Cl, Br, I, and noble gases).

In a first aspect, the present disclosure relates to a method for blocking one or more portions of one or more trenches during manufacture of a semiconductor structure, the method comprising (a) providing a substrate comprising one or more trenches, and a dielectric material under the one or more trenches, (b) providing a first overlayer on the substrate, thereby filling the one or more trenches, the first overlayer having a planar top surface, a top portion of the first overlayer, comprising the top surface, being etchable selectively with respect to a condensed photo-condensable metal oxide, (c) covering a first area of the top surface, situated directly above the one or more portions and corresponding thereto, with a block pattern of the condensed photo-condensable metal oxide, thereby leaving a second area of the top surface, having at least another portion of at least one of the trenches thereunder, uncovered, (d) covering the block pattern and the second area with a second overlayer having a planar top surface, a bottom portion of the second overlayer, in contact with the block pattern and the second area, being etchable selectively with respect to the condensed photo-condensable metal oxide and with respect to the top portion of the first overlayer, (e) providing a masking layer over the second overlayer, the masking layer having a via pattern, and (f) transferring the via pattern and the other portion of the at least one of the trenches into the dielectric material.

In step a of the method, a substrate is provided. The substrate comprises one or more trenches and a dielectric material under the one or more trenches.

In embodiments, directly under the trenches, the substrate may comprise a hardmask. This hardmask will also hereinafter be called "memory layer" since it records the trench and via pattern. This hardmask would therefore form the bottom of the trenches. A hardmask directly under the trenches may be beneficial in embodiments where the material used to form the sidewalls of the trenches is not sufficiently etch-resistant to survive the entire trench and via transfer process. This will typically be the case when the trenches are defined in a spacer material (e.g. $Si_3N_4$, $SiO_2$, AlN or $TiO_2$), for example formed therein using an ArF lithography, an EUV lithography or a spacer defined technology. The hardmask may for instance be a TiN layer.

A hardmask is however superfluous if the sidewalls of the trenches are defined in a condensed photo-condensable metal oxide. Indeed, condensed photo-condensable metal oxides are typically sufficiently etch-resistant to survive the entire trench and via transfer process.

In some embodiments, the substrate may therefore further comprise a condensed photo-condensable metal oxide layer in which the sidewalls of the one or more trenches are defined.

In general, a photo-condensable metal oxide layer may be easily patterned, e.g. in a fashion analogous to how a photoresist can be patterned using an EUV lithography, while being hard enough to suitably resist against being etched during the process of transferring trenches and vias in the dielectric layer. As such, a condensed photo-condensable metal oxide layer has the combined benefits of a hardmask and of a photoresist in a single layer.

Typically, directly under the hardmask, or directly under the trenches if no hardmask is present, the substrate comprise the dielectric layer. Hence, if the trenches have condensed photo-condensable metal oxide side walls, the bottom of the trenches will typically be made of the dielectric layer. The dielectric layer may be a low-k dielectric layer. The deepening of the trenches is typically stopped in this dielectric layer.

Directly under the dielectric layer, the substrate may typically comprise a blocking layer such as a SiCO and/or SiCN layer.

Directly under the blocking layer, the substrate may typically further comprise a semiconductive part, such as a semiconductor (e.g. Si) wafer. The semiconductive part may typically comprise semiconductor devices such as transistors forming a so-called M0 level, and the trenches will be used to form conductive lines at a so-called M1 level, with the vias connecting part of the M1 level with part of the M0 level. The disclosure may however also be used to connect a $M_{n+1}$ level with the underlying $M_n$ level, where n is an integer equal to at least 1.

In step b, the first overlayer fills the one or more trenches.

The first overlayer may provide a planarization of the device under construction by completely filling the one or more trenches and presenting a planar top surface. In embodiments, filling the one or more trenches may comprise overfilling the one or more trenches. By overfilling the one or more trenches, a first overlayer is typically formed which uniformly covers an area of the substrate, including a surface of the substrate in between two trenches. In embodiments, the first overlayer may be planarized by using a chemical-mechanical polishing.

In embodiments, the first overlayer may comprise a single layer or a plurality of sub-layers. The first overlayer may consist of one or two layers. The first overlay may include a planarization layer filling completely the one or more trenches and, optionally, a hardmask layer thereon. In embodiments, the planarization layer may be a spin-on-carbon layer (SOC). In embodiments, the optional hardmask layer may be a spin-on-glass (SOG), a $SiO_2$, a SiOC or a $Si_3N_4$ layer. In embodiments, after step d, the second overlayer may be directly in contact with the first overlayer; i.e. an area exists where the first overlayer and the second overlayer are not separated by any further layers. In some embodiments, the contact may consist of a contact between two different materials. The optional hardmask layer is typically used to provide this contact between two different materials, when at least a top surface of the planarization layer and a bottom surface of the second overlayer consist of the same material.

The trench referred to in the present disclosure is typically a concave shape in the substrate, which is longer than wide. The substrate will typically have more than one of such trenches. They are typically disposed parallel to each other. They are typically placed at a regular interval following a certain pitch. In embodiments, the substrate may comprise two or more trenches disposed with a pitch of 45 nm or less, including 30 nm or less, such as 20 nm or less. The pitch is defined as being the distance between a longitudinal side of a trench and the corresponding longitudinal side of a neighbouring trench. The pitch is therefore equal to the distance between two trenches plus the width of a trench. In embodiments, the one or more trenches may have a width of 25 nm or less, including 13 nm or less, such as 9.5 nm or less. In embodiments, the one or more trenches may be formed using an ArF lithography, an EUV lithography or a spacer defined technology such as self-aligned multiple patterning (SAMP). Examples of SAMP are self-aligned double patterning (SADP), self-aligned quadruple patterning (SAQP), and self-aligned octuple patterning (SAOP). In the case of a spacer defined technology, the side-walls of the trenches are the side-walls of the spacers and the bottom of the trenches is part of the top surface of the layer directly underlying the spacers. The layer directly underlying the spacers is typically a hardmask layer such as TiN.

In the method of the present disclosure, the trenches in the substrate may be longer than necessary for the particular envisioned connection scheme. Hence, the blocking of portions of these trenches may fulfil the purpose of precisely limiting the length of the trenches to the parameters of the connection scheme. The portion referred to in the present disclosure is a segment of a trench along its length. It is defined by the entire width of the trench and by only part of its length. Blocking a portion means entirely covering that trench portion with a block pattern, and leaving the rest of that trench uncovered, so as to prevent that portion of the trench to be ultimately transferred into the dielectric material. Hence, in step f, the transfer of the other portion of the at least one of the trenches into the dielectric material will create therein two co-linear trenches linearly separated by a distance corresponding to the length of the portion of the original trench which has been blocked. Some embodiments of the present disclosure allow for two new co-linear trenches to have well-defined length, determined by the position of the blocked portion. The deepening of the trenches can for instance comprise first the transfer of the blocked trench pattern into a hardmask underlying the original trenches, followed by a transfer of the pattern now present in the hardmask to the underlying dielectric layer of the substrate, such as a low-k dielectric layer. These trenches in the dielectric layer can then be metalized to serve as connecting lines.

The method of the present disclosure is typically used during manufacture of a semiconductor device, such as a device comprising one or more field effect transistors at a M0 level. The method of the present disclosure can for instance be used to form connecting lines at a M1 level and vias connecting these lines with contacts at a M0 level.

Typically, step f comprises transferring the via pattern down to the bottom of the dielectric layer, in the blocking layer if present, in order to expose a portion of the semiconductive part to which the via will allow an electrical connection to be made.

The trenches and the vias in the present method are typically used in interconnecting different parts of the semiconductor device.

In embodiments, the method may further comprise, after step f, filling at least partially the trenches and the vias in the dielectric layer with a conductive material.

The conductive material may be a metal, such as copper, cobalt, ruthenium or NiSi. The trenches and/or the vias may be lined with one or more barrier layers prior to filling it with the conductive material. Filling the at least one opening with the conductive material typically forms connecting lines and vias and may for example comprise a damascene or dual damascene process.

The block pattern is made of a condensed photo-condensable metal oxide. In other words, the block pattern is made of a metal oxide formed by photocondensation, such as a metal oxide or a composition comprising a metal oxide (which can be a metal suboxide). Since the block pattern is made of a metal oxide, it typically has different etching properties than typical photoresists, that are organic materials, and different etching properties than traditional hardmasks such as non-oxide hardmasks (e.g. TiN or $Si_3N_4$) or hardmasks which comprise oxygen but no metal (e.g. comprising a metalloid such as Si instead of a metal, like in the case of SOG or SiOC). This permits mutual selective etching among 1) the condensed photo-condensable metal oxide, 2) an organic material (e.g. a polymer such as a SOC material or an organic photoresist), and 3) a hard mask which is not a metal oxide (e.g. a non-oxide hardmasks or a hardmask which comprise oxygen but no metal). The metal oxide is a photo-condensable metal oxide. A photo-condensable metal oxide may also be referred to as a photo-condensable molecular metal oxide. "Photo-condensable" means that it can be condensed, i.e. hardened, upon exposure to a suitable light. As such, it behaves like a photoresist but is typically much more etch resistant than traditional photoresists. The block pattern is formed of condensed photo-condensable metal oxide, i.e. photo-condensable metal oxide that has been condensed by exposure to a suitable light, e.g. EUV light.

The condensed photo-condensable metal oxide may be easily patterned, e.g. as a block pattern, while being etch resistant enough to suitably resist against etching during etching of the first and second overlayers (e.g. during step f of transferring the pattern), and in particular during etching of the first overlayer. As such, the condensed photo-condensable metal oxide has combined benefits of a separate hardmask layer and a separate photoresist layer in a single layer. Patterning the photo-condensable metal oxide may for example be done using an EUV lithography to condense a pattern within an uncondensed photo-condensable metal oxide. In embodiments, the first overlayer may be etchable selectively with respect to the condensed photo-condensable metal oxide. In other words, at least one etching chemistry may exist which etches the first overlayer selectively with respect to the condensed photo-condensable metal oxide.

In embodiments, step c may include: (c1) providing a layer of a photo-condensable metal oxide, (c2) exposing an area of the layer of photo-condensable metal oxide to a light source, such that the area of the layer condenses into the block pattern of condensed photo-condensable metal oxide, and (c3) removing any uncondensed photo-condensable metal oxide.

A condensed photo-condensable metal oxide is obtained after irradiation at a suitable wavelength for the photo-condensable metal oxide. For instance, the photo-condensable metal oxide may be condensable under EUV irradiation.

In embodiments, one or more of the photo-condensable metal oxides used in embodiments of the present disclosure may comprise an organo-tin compound.

In embodiments, the organo-tin compound may be an organometallic compound having a general chemical formula of $RSnO_{(3/2-x/2)}(OH)_x$ where $(0<x<3)$, where R is an alkyl group or cycloalkyl group with 3-31 carbon atoms, where the alkyl or cycloalkyl group is bonded to the tin at a secondary or tertiary carbon atom, as described in WO2016065120, the content of which being incorporated herein by reference.

In embodiments, the photo-condensable metal oxides may comprise or be a metal oxo-hydroxo network with organic ligands with a metal carbon bonds and/or with metal carboxylate bonds, as described in WO 2015/026482, the content of which being incorporated herein by reference.

In embodiments, the photo-condensable metal oxide may comprise or be a metal oxide hardmask formed from an aqueous hardmask precursor composition comprising polyoxometal clusters and polyatomic inorganic anions, as described in WO 2012/118847, the content of which being incorporated herein by reference.

In embodiments, the photo-condensable metal oxide may be a composition comprising metal suboxide cations, ligands comprising a peroxide group and inorganic polyatomic anions, wherein the composition has a molar concentration ratio of ligands to metal suboxide cations of at least about 2, as described in EP2392969, the content of which being incorporated herein by reference.

In embodiments, the second overlayer may comprise a spin-on-glass layer and/or a spin-on-carbon layer. The second overlayer may typically consist of a spin-on-glass layer and/or a spin-on-carbon layer. In embodiments, the second overlayer may consist of a single material. In embodiments, after step e, the second overlayer may be directly in contact with the masking layer, with the block pattern and with the second area of the substrate.

In embodiments, steps c and d may be repeated one or more times. In that case, the top surface referred to in the repeated step c refers to the top surface of the last deposited overlayer (e.g. the top surface of the second overlayer deposited in the first step d if it is the first time step c is repeated).

In embodiments, the masking layer may comprise a photoresist layer or a condensed photo-condensable metal oxide layer. In some embodiments, the masking layer may consist of the combination of a photoresist patterned layer and a hardmask thereunder or may consist of a condensed photo-condensable metal oxide layer. Any chemically amplified resist may typically be suitable for forming the masking layer. In some embodiments, the masking layer may be an EUV masking layer. The via pattern is typically formed in the masking layer using a suitable lithographic procedure, such as using an EUV lithography.

In some embodiments, step f may comprise: transferring the via pattern into the dielectric layer, removing the masking layer, removing the second overlayer, and etching away the first overlayer present over the second area selectively with respect to the first area by using the block pattern as an etching mask.

In a first set of embodiments, the first overlayer may consist of a spin-on-carbon planarization layer, the second overlayer may consist of a spin-on-glass layer and a spin-on-carbon layer thereon, and the masking layer may consist of a spin-on-glass layer and a photoresist layer thereon.

In a second set of embodiments, the first overlayer may consist of a spin-on-carbon planarization layer, the second overlayer may consist of a spin-on-glass layer and a spin-on-carbon layer thereon, and the masking layer may consist of a condensed photo-condensable metal oxide layer.

In a third set of embodiments, the first overlayer may consist of a spin-on-carbon planarization layer, the second overlayer may consist of a spin-on-glass layer, and the masking layer may consist of a condensed photo-condensable metal oxide layer.

In a fourth set of embodiments, the first overlayer may consist of a spin-on-carbon planarization layer and a spin-on-glass hardmask layer thereon, the second overlayer may consist of a spin-on-glass layer, and the masking layer may consist of a spin-on-glass layer and a photoresist layer thereon.

In a fifth set of embodiments, the first overlayer may consist of a spin-on-carbon planarization layer and a spin-on-glass hardmask layer thereon, the second overlayer may consist of a spin-on-glass layer, and the masking layer may consist of a condensed photo-condensable metal oxide layer.

In a second aspect, the present disclosure relates to a semiconductor structure, comprising (a) a substrate comprising one or more trenches, and a dielectric material under the one or more trenches, (b) a first overlayer on the substrate, filling the one or more trenches and having a planar top surface, a top portion of the first overlayer, comprising the top surface, being etchable selectively with respect to a condensed photo-condensable metal oxide, (c) a block pattern of a condensed photo-condensable metal oxide, the block pattern covering a first area of the top surface, the first area being situated directly above one or more portions of the one or more trenches and corresponding to these portions, a second area of the top surface, having at least another portion of at least one of the trenches thereunder, remaining uncovered, and (d) a second overlayer having a planar top surface, a bottom portion of the second overlayer, in contact with the block pattern and the second area, being etchable selectively with respect to the condensed photo-condensable metal oxide and with respect to the top portion of the first overlayer.

In embodiments, the structure may further comprise a masking layer over the second overlayer, wherein the masking layer has a via pattern.

In embodiments, the structure may further comprise trenches and vias in the dielectric material. The masking layer is typically no longer present in that embodiment.

In a first set of embodiments, the first overlayer may consist of a spin-on-carbon planarization layer, the second overlayer may consist of a spin-on-glass layer and a spin-on-carbon layer thereon, and the masking layer, if present, may consist of a spin-on-glass layer and a photoresist layer thereon.

In a second set of embodiments, the first overlayer may consist of a spin-on-carbon planarization layer, the second overlayer may consist of a spin-on-glass layer and a spin-on-carbon layer thereon, and the masking layer, if present, may consist of a condensed photo-condensable metal oxide layer.

In a third set of embodiments, the first overlayer may consist of a spin-on-carbon planarization layer, the second overlayer may consist of a spin-on-glass layer, and the masking layer, if present, may consist of a condensed photo-condensable metal oxide layer.

In a fourth set of embodiments, the first overlayer may consist of a spin-on-carbon planarization layer and a spin-on-glass hardmask layer thereon, the second overlayer may consist of a spin-on-glass layer, and the masking layer, if present, may consist of a spin-on-glass layer and a photoresist layer thereon.

In a fifth set of embodiments, the first overlayer may consist of a spin-on-carbon planarization layer and a spin-on-glass hardmask layer thereon, the second overlayer may consist of a spin-on-glass layer, and the masking layer, if present, may consist of a condensed photo-condensable metal oxide layer.

In any embodiment, any feature of the second aspect and its embodiments may independently be as correspondingly described for the first aspect and its embodiments.

The disclosure will now be described by a detailed description of several embodiments. It is clear that other embodiments of the disclosure can be configured according to the knowledge of the person skilled in the art without departing from the true technical teaching of the disclosure, the disclosure being limited only by the terms of the appended claims.

Reference will be made to transistors. These are (three-terminal) devices having a first main electrode such as a drain, a second main electrode such as a source and a control electrode such as a gate for controlling the flow of electrical charges between the first and second main electrodes.

COMPARATIVE EXAMPLE

Figure 8:
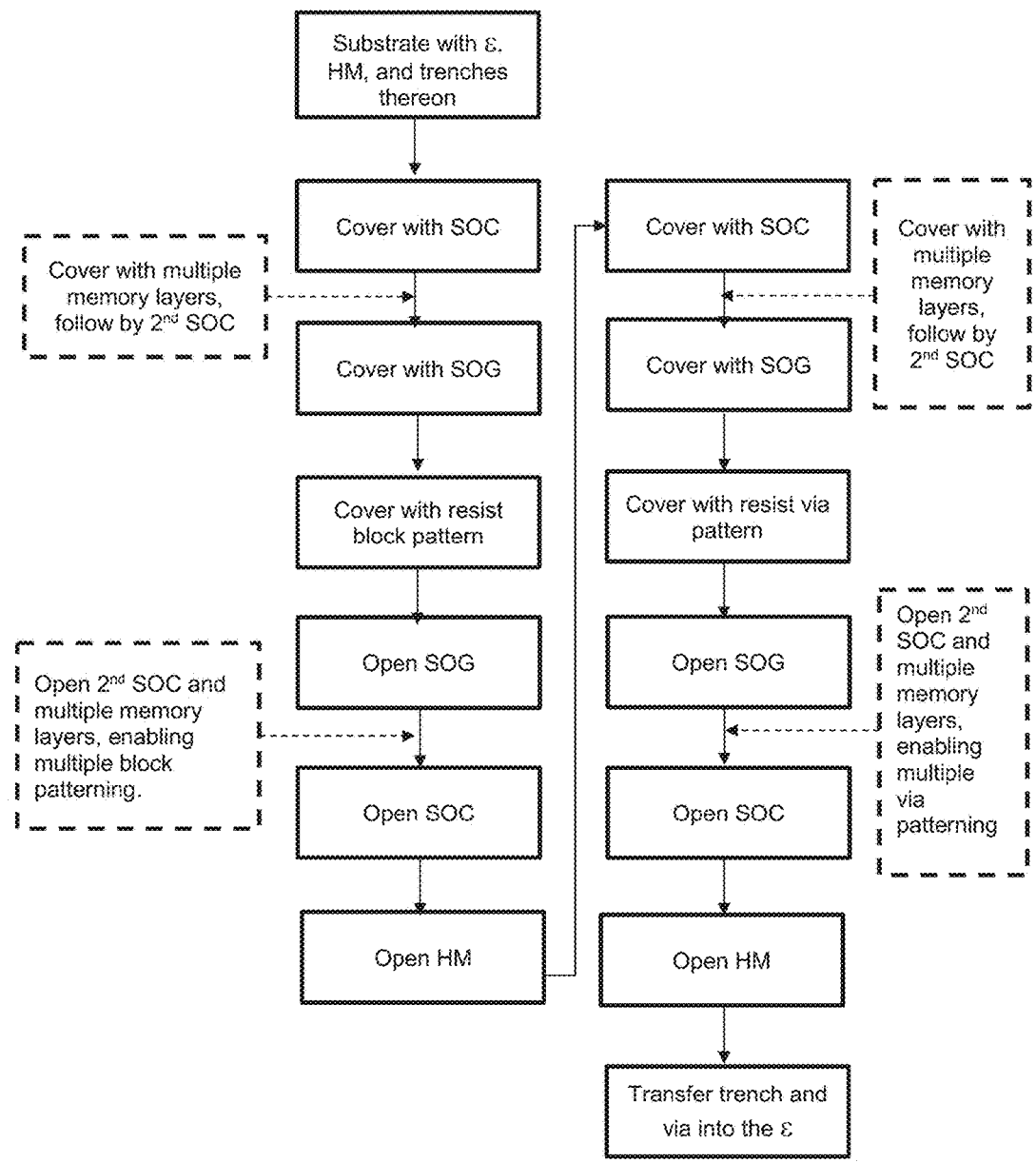
FIG. 8 is a flowchart showing the main steps in a prior art process.
Figure 9:
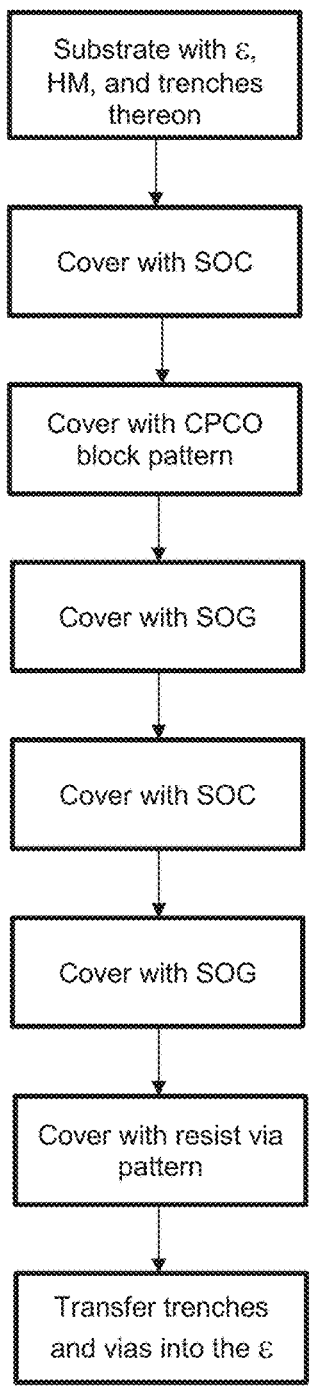
FIG. 9 is a flowchart showing the main steps of a process according to an example embodiment.
Figure 10:
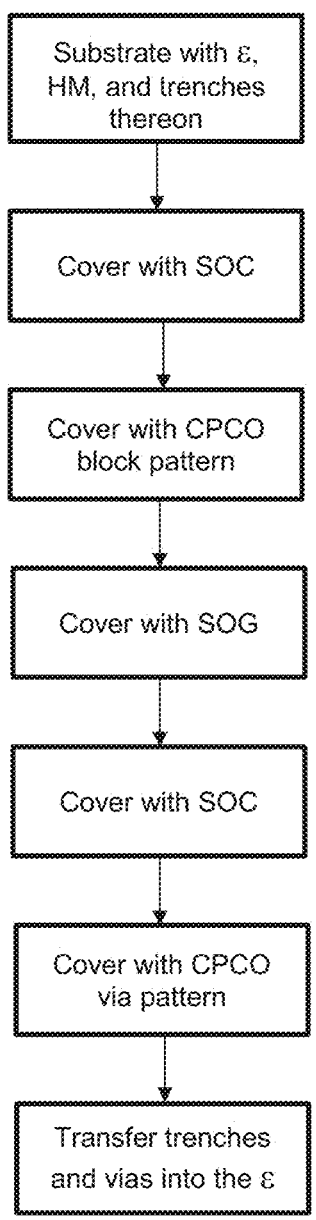
FIG. 10 is a flowchart showing the main steps of a process in accordance with the embodiment illustrated in FIG. 4, where a condensed photo-condensable metal oxide masking layer is used to replace the masking layer provided in FIG. 2d.
Figure 11:
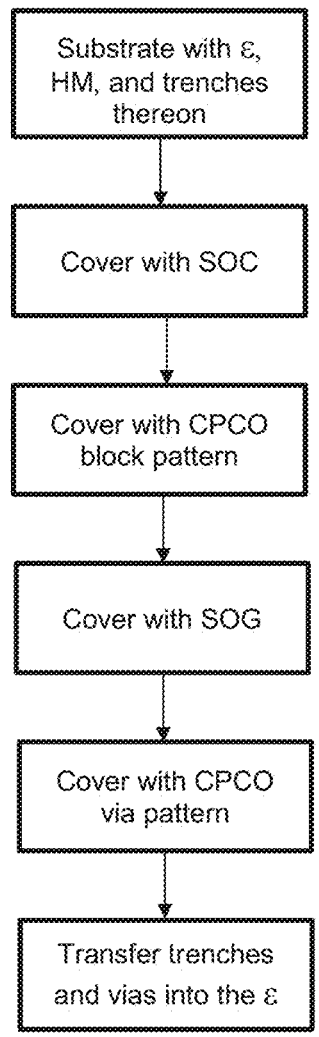
FIG. 11 is a flowchart showing the main steps of a process according to an example embodiment illustrated in FIG. 5.
Figure 12:
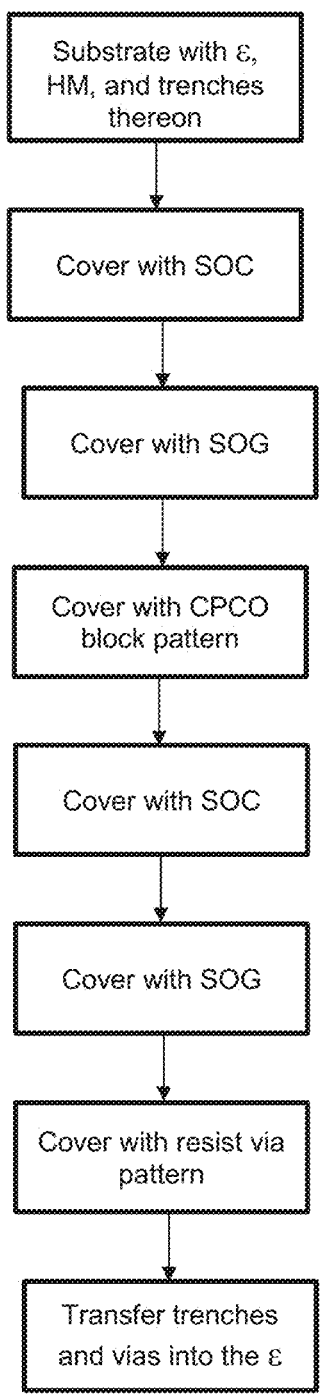
FIG. 12 is a flowchart showing the main steps of a process according to an example embodiment illustrated in FIG. 6.
Figure 13:
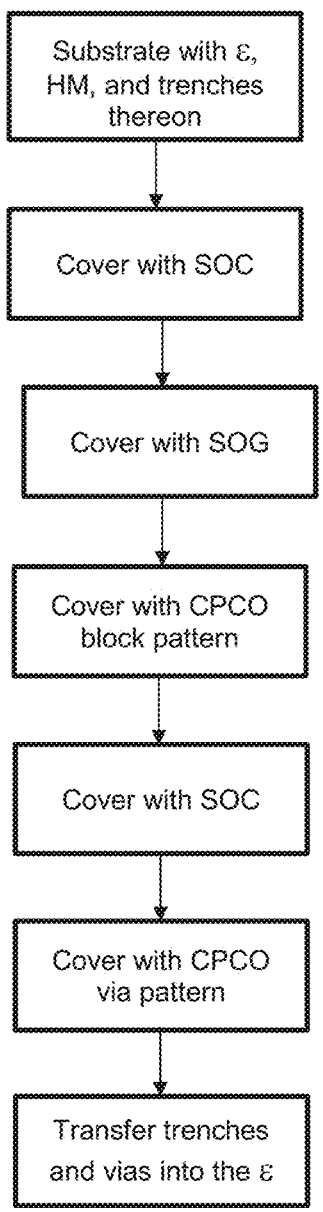
FIG. 13 is a flowchart showing the main steps of a process according to an example embodiment illustrated in FIG. 7.

A (Simplified) Process Flow of the Prior Art for Forming Trench and Via Openings in a Semiconductor Structure We now refer to FIG. 8.

A substrate comprising trenches, a hardmask (HM) thereunder and a dielectric layer (ε) under the hardmask (HM) is provided. We now refer to FIG. 1a. The substrate (100) typically comprises a Si wafer (110) (which may typically comprise one or more semiconductor devices, such as transistors), a blocking layer (120) (e.g. a SiCO and/or SiCN layer), a low-k dielectric layer (130), a TiN hardmask memory layer (210) and a spacer material (220) (e.g. $Si_3N_4$, $SiO_2$, AlN or $TiO_2$) defining the trenches (700). In addition to the low-k dielectric layer (130), a barrier layer is typically present directly under it (not shown) and an oxide capping layer is typically present directly on it (not shown).

We now turn back to FIG. 8. The trenches are filled and covered with a spin-on-carbon (SOC) first overlayer. Subsequently, a spin-on-glass layer (SOG) is provided over the SOC layer and a photoresist block pattern is formed thereon. The block pattern is transferred to the SOG, the SOC, and the HM, then the patterned HM is covered with a SOC layer, then with a masking layer consisting of an SOG layer and a photoresist, is provided thereon and a via pattern (i.e. a pattern for forming via openings) is defined in the photoresist.

The via pattern is etched down to the SOG layer, the SOC layer and is etched further down to the HM. The via pattern and the blocked trench pattern are then etched further down into the low-k dielectric layer. During these pattern transfers, the photoresist, the SOG layer and the SOC layer are consecutively stripped. This stripping may be performed as a separate step or it may occur as a consequence of etching down the pattern.

In further steps, which are not depicted, the trench and via openings may be filled with a contact metal, e.g. using a damascene process.

Also depicted in FIG. 8 are optional additional steps (dashed outlines) which are performed when multiple block and/or multiple via patterning is desired. These optional steps include covering the SOC layer (of the first box of the flowchart and/or the seventh box of the flowchart) with multiple memory (hard mask) layers and a further SOC layer. In such cases, the process comprises, after opening the SOG and before opening the corresponding SOC, opening the further SOC layer and the multiple memory layers.

As can be seen in this flowchart, this process entails many steps. Some embodiments permit to considerably reduce the number of steps as it will be illustrated in details in the following example embodiments.

EXAMPLE 1

A First Process Flow for Forming Trench and Via Openings in a Semiconductor Structure A first process flow for forming trench and via openings in a semiconductor structure, using a method and structures according to the present disclosure, is described.

We now refer to FIG. 1. A substrate (100) comprising trenches (700) is provided. In a first version, see FIG. 1a, the substrate (100) comprises a Si wafer (110) (which may typically comprise one or more semiconductor devices present at the lowest metallization level ($M_0$ level) of the device, such as transistors, and/or may comprise $M_{n-1}$ level metal conductive lines, wherein $M_n$ is the level corresponding to the conductive lines that will be enabled by the trenches (700)), a blocking layer (120) (e.g. a SiCO and/or SiCN layer), a low-k dielectric layer (130), a TiN hardmask memory layer (210) and a spacer material (220) (e.g. $Si_3N_4$, $SiO_2$, AlN or $TiO_2$) defining the trenches (700). In an alternative version, see FIG. 1b, the substrate (100) comprises a Si wafer (110), a blocking layer (120) (e.g. a SiCO and/or SiCN layer), a low-k dielectric layer (130) and a condensed photo-condensable metal oxide (250) in which the trenches (700) are defined.

We now refer to FIG. 2. The trenches (700) are filled and covered with a spin-on-carbon (SOC; 310) first overlayer (300) (FIG. 2a). Subsequently, a photo-condensable metal oxide layer is provided over the first overlayer (300) and a block pattern (400) is formed therein (FIG. 2b). The block pattern (400) is covered with a second overlayer (500) layer consisting of a spin-on-glass (SOG; 510) (FIG. 2c) and SOC layer (520) (FIG. 2d). A masking layer (600) consisting of an SOG layer (610) and a photoresist (620) is provided thereon and a via pattern (800) (i.e. a pattern for forming via openings) is defined in the photoresist (620) (FIG. 2d).

We now refer to FIG. 3. The via pattern (800) is etched down to the SOG layer (510) of the second overlayer (500) and the photoresist (620) is removed (FIG. 3a). The via pattern (800) is etched further down to the hardmask memory layer (210) and the SOG (610) of the masking layer (600) and the SOC (520) of the second overlayer (500) are removed (FIG. 3b). The via pattern (800) is etched yet further down into the low-k dielectric layer (130), and the SOG (510) of the second overlayer (500) layer is removed (FIG. 3c). The first overlayer (300) is removed where it is not covered by the block pattern (400), thereby exposing trench portions (710) (FIG. 3d). These trench portions (710) are in turn etched down to the low-k dielectric layer (130), forming interruptions at the trench portions (720) present underneath the block pattern (400), and the block pattern (400) is removed (FIG. 3e). The remainder of the first overlayer (300) is removed (FIG. 3f). Finally, the trench (700) and via (800) patterns are etched further down, until the via openings expose part of the Si wafer (110) (typically until the via openings expose contacts to devices comprised in that substrate) or until the via openings expose $M_{n-1}$ level metal conductive lines (FIG. 3g).

In further steps, which are not depicted, the spacer material (220) and hardmask memory layer (210) may be removed and the trench and via openings may be filled with a contact metal, e.g. using a damascene process. The hardmask memory layer (210) can for example be removed by means of chemical mechanical polishing after the trench and via openings are filled with the contact metal.

Figure 3A:
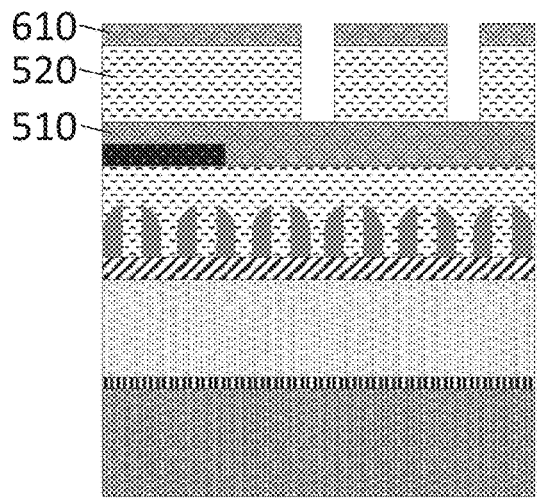
FIGS. 3a-3g are schematic representations of vertical cross-sections of semiconductor structures obtained at different stages of manufacture, according to an example embodiment.
Figure 3B:
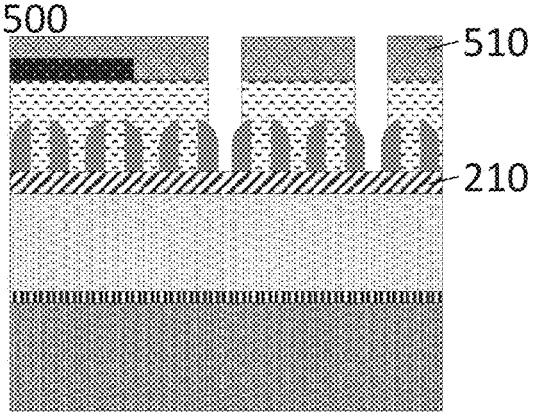
Figure 3C:
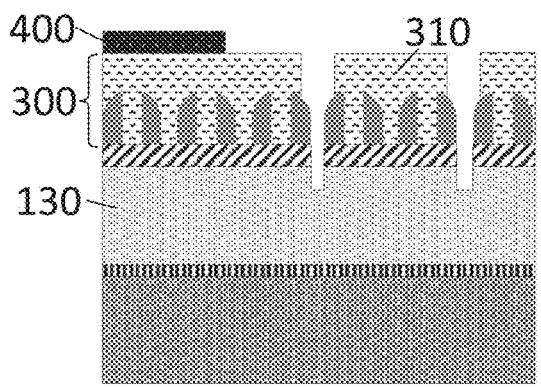
Figure 3D:
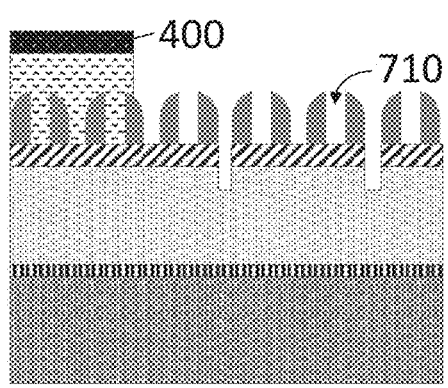
Figure 3E:
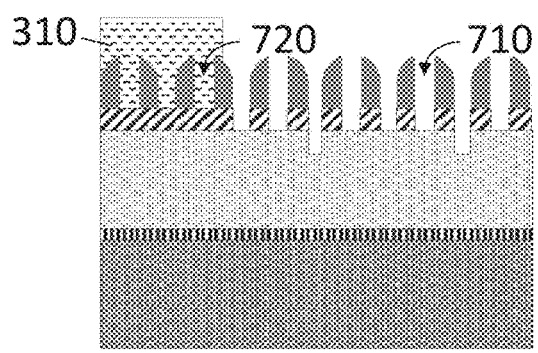
Figure 3F:
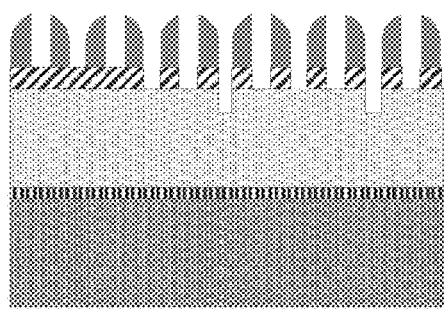
Figure 3G:
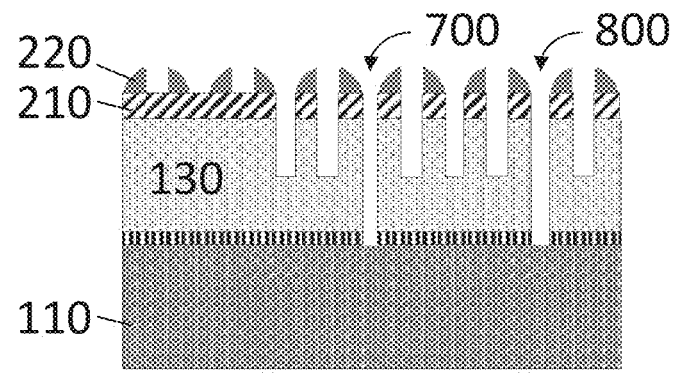
Figure 4:
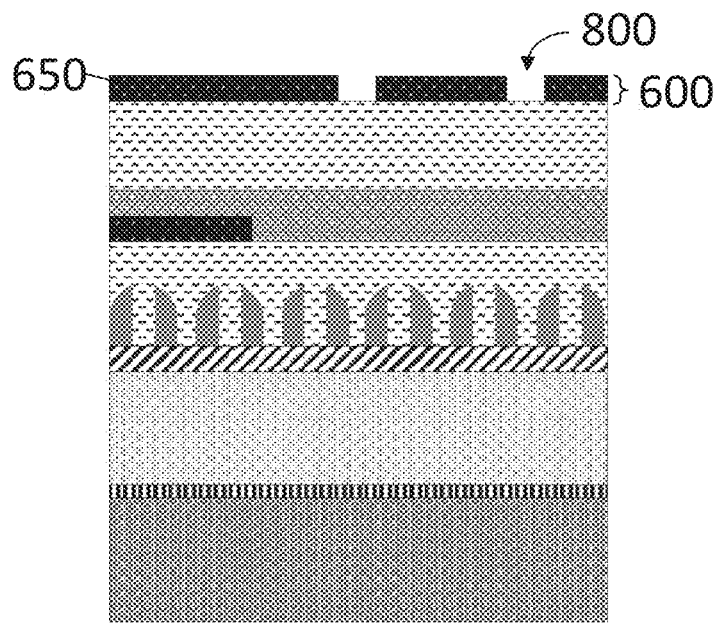
FIG. 4 is a schematic representation of a vertical cross-section of a semiconductor structure obtained when a condensed photo-condensable metal oxide masking layer is used to replace the masking layer provided in FIG. 2d.

We now refer to FIG. 4. In an alternative version of this first example, the masking layer (600) may consist of a photo-condensable metal oxide (650) and the via pattern (800) may be defined in the photo-condensable metal oxide (650). The other steps being analogous to what was already described with respect to FIG. 3.

EXAMPLE 2

A Second Process Flow for Forming Trench and Via Openings in a Semiconductor Structure A second process flow for forming trench and via openings in a semiconductor structure, using a method and structures according to the present disclosure, is described.

Figures 5A, 5B:
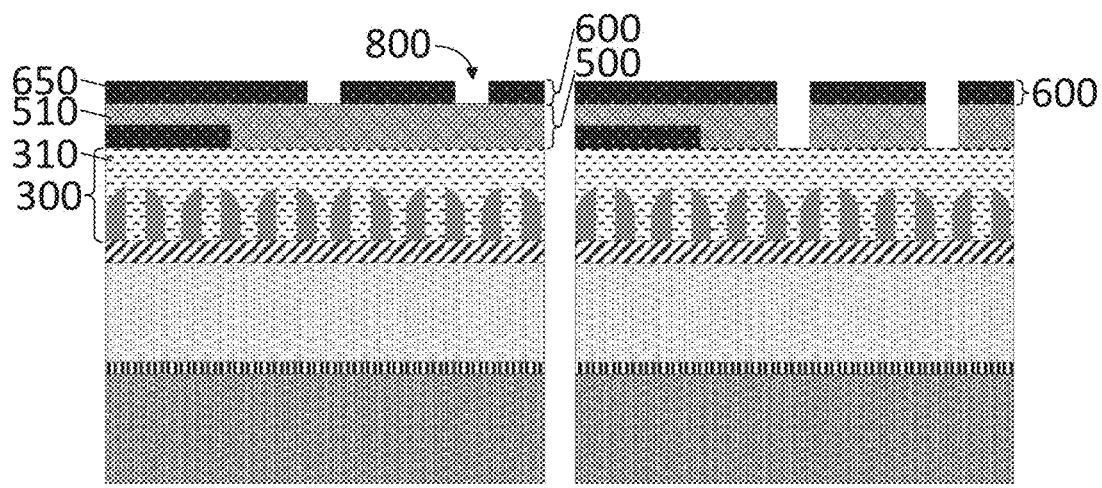
FIGS. 5a-5d are schematic representations of vertical cross-sections obtained at different stages of manufacture, according to an example embodiment.
Figures 5C, 5D:
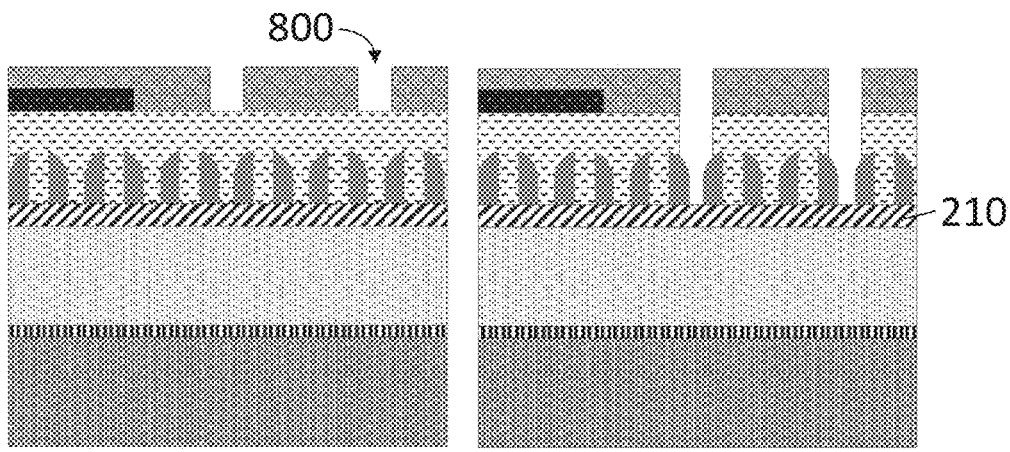

We now refer to FIG. 5. The same process flow as in example 1 is followed up to the stage depicted in FIG. 2c. In this example, the second overlayer (500) layer consists of an SOG layer. A masking layer (600) consisting of a photo-condensable metal oxide (650) is provided thereon and the via pattern (800) is defined in the photo-condensable metal oxide (650) (FIG. 5a). The via pattern (800) is etched down to the SOC (310) layer of the first overlayer (300) (FIG. 5b). The masking layer (600) is removed (FIG. 5c). Subsequently, the via pattern (800) is etched further down to the hardmask memory layer (210) (FIG. 5d). Further steps are as previously described in example 1 (FIGS. 3c-g).

EXAMPLE 3

A Third Process Flow for Forming Trench and Via Openings in a Semiconductor Structure A third process flow for forming trench and via openings in a semiconductor structure, using a method and structures according to the present disclosure, is described.

Figures 6A, 6B:
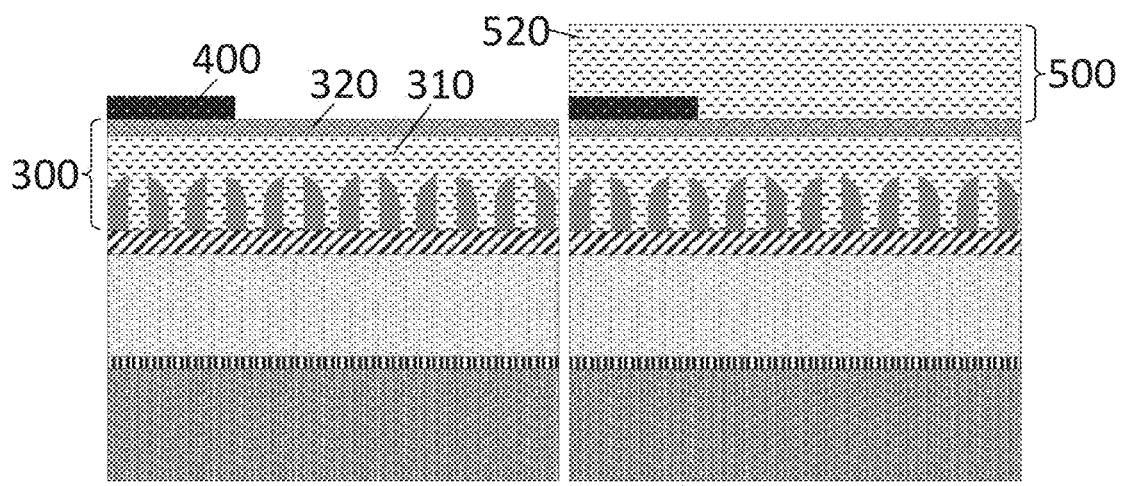
FIGS. 6a-c are schematic representations of vertical cross-sections obtained at different stages of manufacture, according to an example embodiment.
Figure 6C:
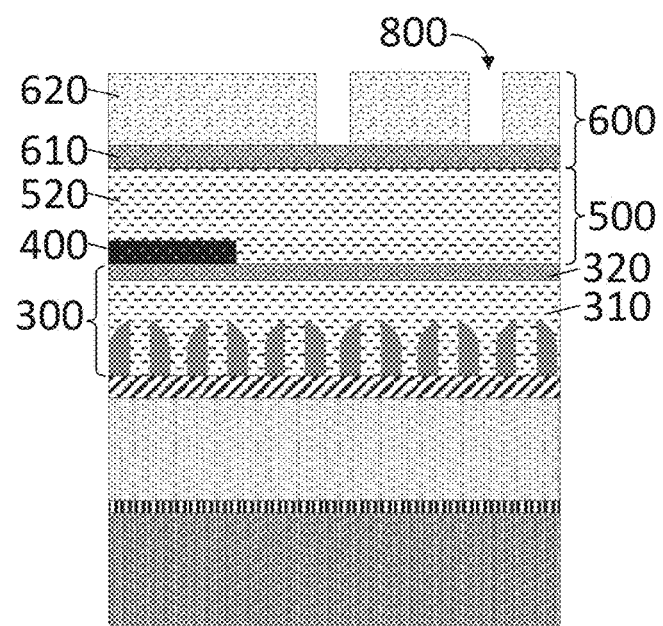
Figures 7A, 7B:
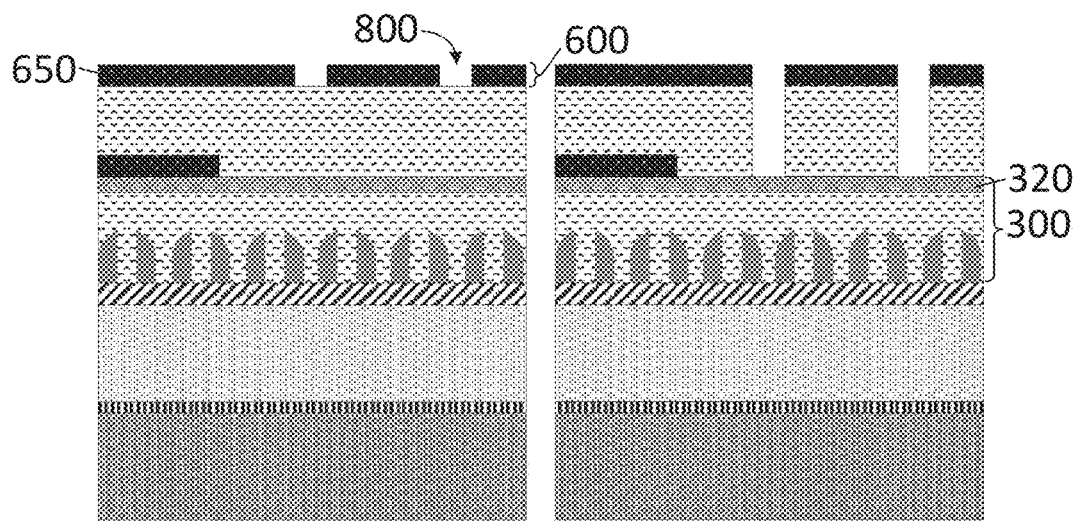
FIGS. 7a-j are schematic representations of vertical cross-sections obtained at different stages of manufacture, according to an example embodiment.
Figures 7C, 7D:
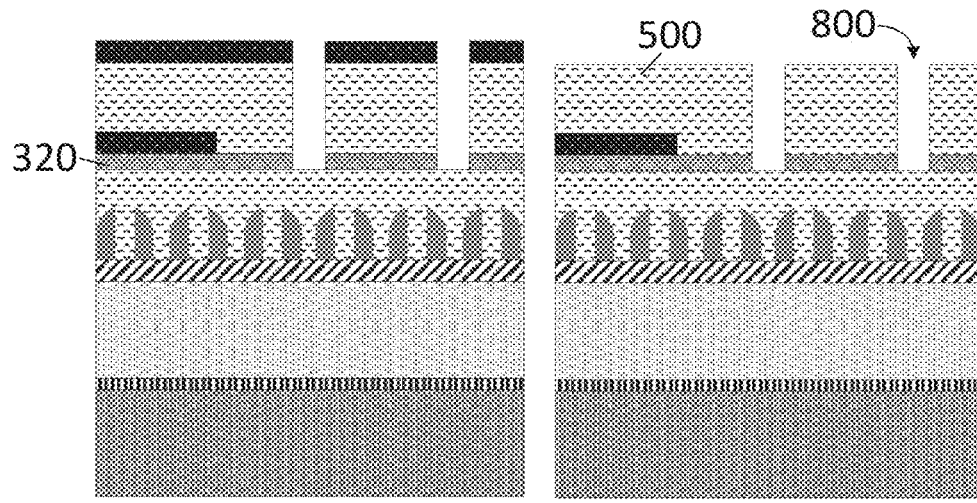
Figure 7E:
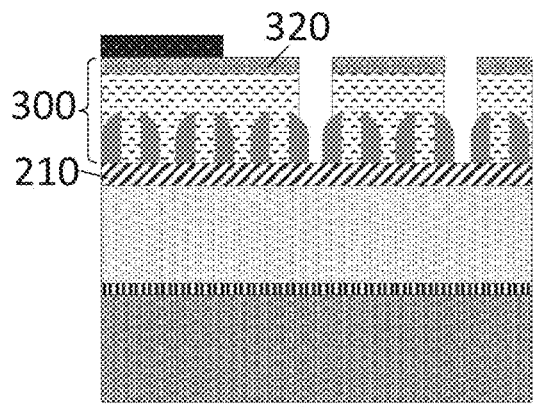
Figure 7F:
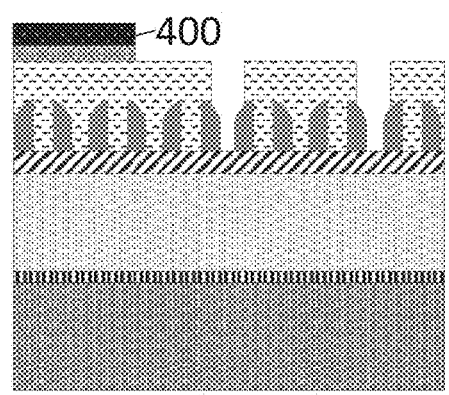
Figure 7G:
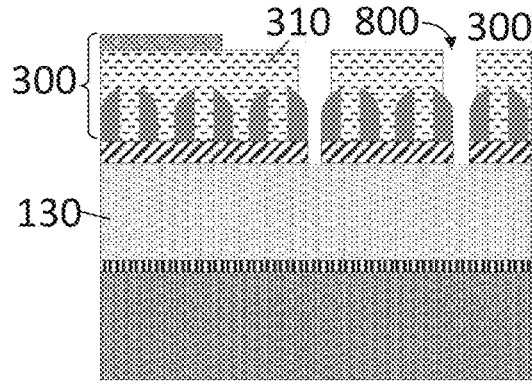
Figure 7H:
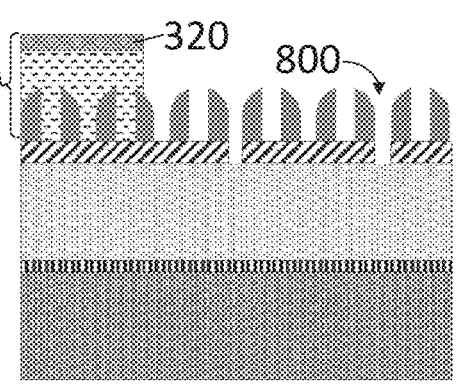
Figure 7I:
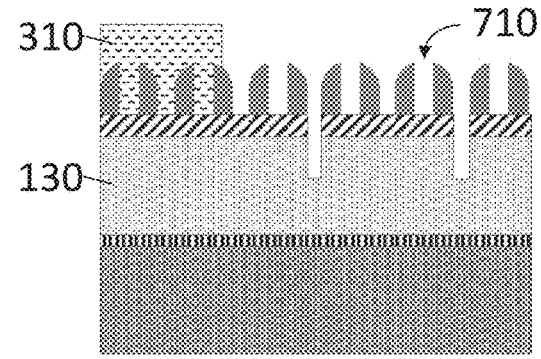
Figure 7J:
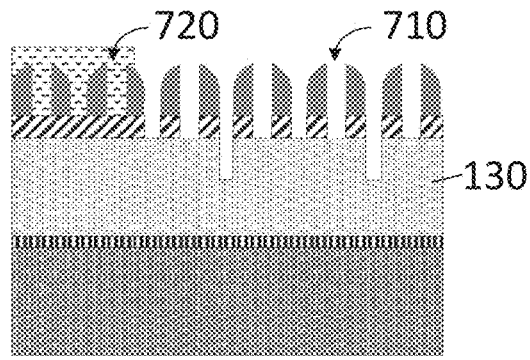

We now refer to FIG. 6. In this case, the first overlayer (300) consists of an SOC layer (310) and an SOG layer (320) thereon, whereupon the condensed photo-condensable metal oxide block pattern (400) is formed (FIG. 6a). The block pattern (400) is covered with a second overlayer (500) consisting of an SOC layer (520) (FIG. 6c). A masking layer (600) comprising an SOG layer (610) and a photoresist (620) is provided thereon and a via pattern (800) is defined in the photoresist (620) (FIG. 6c).

Further steps (not depicted) are analogous to those described in example 4 (FIGS. 7b-j).

EXAMPLE 4

A Fourth Process Flow for Forming Trench and Via Openings in a Semiconductor Structure A fourth process flow for forming trench and via openings in a semiconductor structure, using a method and structures according to the present disclosure, is described.

We now refer to FIG. 7. A similar structure as in example 3 is formed, but the masking layer (600) consists of a photo-condensable metal oxide (650) (FIG. 7a). The via pattern (800) is etched down to the SOG layer (320) of the first overlayer (300) (FIG. 7b), after which the SOG layer (320) is opened (FIG. 7c) and the masking layer (600) is removed (FIG. 7d). The via pattern (800) is etched further down to the hardmask memory layer (210) and the second overlayer (500) is removed (FIG. 7e). The SOG (320) of the first overlayer (300) is removed where it is not covered by the block pattern (400) (FIG. 7f). The via pattern (800) is etched further down to the low-k dielectric layer (130) (FIG. 7g) and the SOC (310) of the first overlayer (300) is removed where it is not covered by the no patterned SOG layer (320) (FIG. 7h). The via pattern (800) is etched yet further down in to the low-k dielectric layer (130) and the remainder of the SOG (320) in the first overlayer (300) is removed (FIG. 7i). The exposed trench portions (710) are etched down to the low-k dielectric layer (130), forming interruptions corresponding to the trench portions which remain covered (720) (FIG. 7j). Further steps are as previously described in example 1 (FIGS. 3f-g).

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for blocking one or more portions of one or more trenches during manufacture of a semiconductor structure, the method comprising:
providing a substrate comprising one or more trenches, and a dielectric material under the one or more trenches,
providing a first overlayer on the substrate, thereby filling the one or more trenches, the first overlayer having a planar top surface, a top portion of the first overlayer, comprising the top surface, being etchable selectively with respect to a condensed photo-condensable metal oxide;
covering a first area of the top surface, situated directly above the one or more portions and corresponding thereto, with a block pattern of the condensed photo-condensable metal oxide, thereby leaving a second area of the top surface, having at least another portion of at least one of the trenches thereunder, uncovered;
covering the block pattern and the second area with a second overlayer having a planar top surface, a bottom portion of the second overlayer, in contact with the block pattern and the second area, being etchable selectively with respect to the condensed photo-condensable metal oxide and with respect to the top portion of the first overlayer;
providing a masking layer over the second overlayer, the masking layer having a via pattern; and
transferring the via pattern and the other portion of the at least one of the trenches into the dielectric material.

2. The method according to claim 1, wherein, after covering the block pattern and the second area with a second overlayer, the second overlayer is directly in contact with the first overlayer.

3. The method according to claim 1, wherein the first overlayer comprises a planarization layer filling completely the one or more trenches and, optionally, a hardmask layer thereon.

4. The method according to claim 3, wherein the optional hardmask layer is a spin-on-glass, a $SiO_2$, a SiOC or a $Si_3N_4$ layer.

5. The method according to claim 1, wherein, after providing the masking layer over the second overlayer, the second overlayer is directly in contact with the masking layer, with the block pattern and with the second area of the top surface.

6. The method according to claim 1, wherein the second overlayer comprises a spin-on-glass layer and/or a spin-on-carbon layer.

7. The method according to claim 1, wherein the second overlayer consists of a single material.

8. The method according to claim 1, wherein the masking layer consists of a patterned photoresist layer on a hard mask layer or consists in a patterned condensed photo-condensable metal oxide layer.

9. The method according to claim 1, wherein covering a first area of the top surface comprises:
providing a layer of a photo-condensable metal oxide;
exposing an area of the layer of photo-condensable metal oxide to a light source, such that the area of the layer condenses into the block pattern of condensed photo-condensable metal oxide; and
removing any uncondensed photo-condensable metal oxide.

10. The method according to claim 1, wherein the one or more trenches comprise condensed photo-condensable metal oxide side walls.

11. The method according to claim 10, wherein the one or more trenches comprise a bottom made of the dielectric material.

12. The method according to claim 1, wherein one or more of the photo-condensable metal oxides comprise an organo-tin compound.

13. A semiconductor structure, comprising:
a substrate comprising one or more trenches, and a dielectric material under the one or more trenches;
a first overlayer on the substrate, filling the one or more trenches and having a planar top surface, a top portion of the first overlayer, comprising the top surface, being etchable selectively with respect to a condensed photo-condensable metal oxide;
a block pattern of a condensed photo-condensable metal oxide, the block pattern covering a first area of the top surface, the first area being situated directly above one or more portions of the one or more trenches and corresponding to these portions, a second area of the top surface, having at least another portion of at least one of the trenches thereunder, remaining uncovered; and
a second overlayer having a planar top surface, a bottom portion of the second overlayer, in contact with the block pattern and the second area, being etchable selectively with respect to the condensed photo-condensable metal oxide and with respect to the top portion of the first overlayer.

14. The structure according to claim 13, further comprising:
a masking layer over the second overlayer, wherein the masking layer has a via pattern.

* * * * *